United States Patent
Liao et al.

(10) Patent No.: US 9,537,449 B1
(45) Date of Patent: Jan. 3, 2017

(54) CRYSTAL OSCILLATION CIRCUIT, GAIN STAGE OF CRYSTAL OSCILLATION CIRCUIT AND METHOD FOR DESIGNING SAME

(71) Applicant: Faraday Technology Corp., Hsin-Chu (TW)

(72) Inventors: Wei-Chieh Liao, Taichung (TW); Chi-Sheng Liao, Taipei (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 14/856,571

(22) Filed: Sep. 17, 2015

(30) Foreign Application Priority Data

Jun. 16, 2015 (TW) .............................. 104119443 A

(51) Int. Cl.
*H03B 5/36* (2006.01)
*G06F 17/50* (2006.01)

(52) U.S. Cl.
CPC ........... *H03B 5/364* (2013.01); *G06F 17/5036* (2013.01)

(58) Field of Classification Search
USPC ........................................................ 331/158
See application file for complete search history.

(56) References Cited

U.S. PATENT DOCUMENTS

| | | | |
|---|---|---|---|
| 5,805,029 A * | 9/1998 | Theus | H03B 5/364 331/116 FE |
| 5,834,975 A | 11/1998 | Bartlett et al. | |
| 6,160,457 A * | 12/2000 | Wu | H03B 5/364 331/116 FE |
| 6,763,470 B1 | 7/2004 | Bell et al. | |
| 7,170,341 B2 | 1/2007 | Conrad et al. | |
| 7,948,329 B2 | 5/2011 | Lim | |
| 2003/0116807 A1* | 6/2003 | Matsuda | H01L 29/0696 257/370 |
| 2006/0087761 A1 | 4/2006 | Kuehlwein | |
| 2008/0116984 A1* | 5/2008 | Maede | H01L 27/0255 331/62 |

(Continued)

FOREIGN PATENT DOCUMENTS

| | | |
|---|---|---|
| CN | 102006057 | 4/2011 |
| JP | S6068705 | 4/1985 |
| TW | 200807875 | 2/2008 |

OTHER PUBLICATIONS

"Office Action of Taiwan Counterpart Application", issued on Jul. 14, 2016, p. 1-p. 6.

*Primary Examiner* — Jeffrey Shin
(74) *Attorney, Agent, or Firm* — Winston Hsu; Scott Margo

(57) ABSTRACT

A crystal oscillation circuit, a gain stage of the crystal oscillation circuit and a method for designing the same are provided. The gain stage includes multiple amplifiers and multiple current-limiting resistors. Input terminals of the amplifiers are coupled together to a first bonding pad, wherein transconductances of the amplifiers are different from each other. The first bonding pad is used for electrically coupling to a first terminal of an oscillation crystal module. First terminals of the current-limiting resistors are respectively coupled to output terminals of the amplifiers in a one-on-one manner, and second terminals of the current-limiting resistors are coupled together to a second bonding pad, wherein the second bonding pad is used for electrically coupling to a second terminal of the oscillation crystal module.

5 Claims, 8 Drawing Sheets

(56) References Cited

U.S. PATENT DOCUMENTS

2011/0241791 A1* 10/2011 Hung ................... H03B 5/36
331/158
2015/0028956 A1* 1/2015 Okamoto ............... H03L 7/16
331/18

* cited by examiner

CRYSTAL OSCILLATION CIRCUIT, GAIN STAGE OF CRYSTAL OSCILLATION CIRCUIT AND METHOD FOR DESIGNING SAME

CROSS-REFERENCE TO RELATED APPLICATION

This application claims the priority benefit of Taiwan application serial no. 104119443, filed on Jun. 16, 2015. The entirety of the above-mentioned patent application is hereby incorporated by reference herein and made a part of this specification.

BACKGROUND OF THE INVENTION

Field of the Invention

The present invention relates to an oscillation circuit, and more particularly to a crystal oscillation circuit, a gain stage of the crystal oscillation circuit and a method for designing the same.

Description of Related Art

Crystal oscillation circuits are important components in a variety of circuits in electronic devices for generating an oscillation frequency required by the circuits. Currently, one of the most common crystal oscillation circuits is, for example, Pierce oscillator, which serves as a gain stage in the form of an inverter, and the circuit thereof is simple, efficient and stable. In general, the gain stage of conventional crystal oscillation circuits has a fixed gain parameter. When selecting different gain stages of the crystal oscillation circuits, a system designer needs to take the power consumption of the whole circuit into consideration sufficiently. However, the difference between the gains of different gain stages in conventional crystal oscillation circuits is too large to be suitable for optimization of the parameters of the crystal oscillation circuits. It is an issue to be overcome how to develop a gain stage that enables a user to set an optimization parameter flexibly according to the environment.

SUMMARY OF THE INVENTION

In view of the above, a crystal oscillation circuit, a gain stage of the crystal oscillation circuit and a method for designing the same are provided. The gain stage described in the embodiments of the invention enables a user to flexibly select/configure a suitable gain stage transconductance according to his requirement. In addition, the gain stage described in the embodiments of the invention further uses current-limiting resistors to protect an inner circuit of the gain stage in the crystal oscillation circuit.

An embodiment of the invention provides a gain stage of crystal oscillation circuit, including a plurality of amplifiers and a plurality of current-limiting resistors. Input terminals of the amplifiers are coupled together to a first bonding pad, wherein transconductances of the amplifiers are different from each other. The first bonding pad is used for electrically coupling to a first terminal of an oscillation crystal module. First terminals of the current-limiting resistors are respectively coupled to output terminals of the amplifiers in a one-on-one manner, and second terminals of the current-limiting resistors are coupled together to a second bonding pad, wherein the second bonding pad is used for electrically coupling to a second terminal of the oscillation crystal module.

In an embodiment of the invention, any of the amplifiers includes a switch unit and an inverter. A first terminal of the switch unit is coupled to the first bonding pad. An input terminal of the inverter is coupled to a second terminal of the switch unit, and an output terminal of the inverter is coupled to a first terminal of a corresponding current-limiting resistor among the current-limiting resistors.

In an embodiment of the invention, any of the amplifiers includes a first transmission gate, a second transmission gate, a first transistor and a second transistor. A first terminal of the first transmission gate is coupled to the first bonding pad. A first terminal of the second transmission gate is coupled to the first bonding pad. A first terminal of the first transistor is coupled to a first voltage source, a second terminal of the first transistor is coupled to a first terminal of a corresponding current-limiting resistor among the current-limiting resistors, and a control terminal of the first transistor is coupled to a second terminal of the first transmission gate. A first terminal of the second transistor is coupled to the second terminal of the first transistor, a second terminal of the second transistor is coupled to a second voltage source, and a control terminal of the second transistor is coupled to a second terminal of the second transmission gate.

In an embodiment of the invention, the gain stage of the crystal oscillation circuit further includes a first diode and a second diode. A cathode of the first diode is coupled to a first power rail, and an anode of the first diode is coupled to the second bonding pad. A cathode of the second diode is coupled to the second bonding pad, and an anode of the second diode is coupled to a second power rail.

In an embodiment of the invention, the gain stage of the crystal oscillation circuit further includes a first diode and a second diode. A cathode of the first diode is coupled to a first power rail, and an anode of the first diode is coupled to the first bonding pad. A cathode of the second diode is coupled to the first bonding pad, and an anode of the second diode is coupled to a second power rail.

An embodiment of the invention provides a crystal oscillation circuit, including a first bonding pad, a second bonding pad, a first resistor, an oscillation crystal module, a first capacitor, a second capacitor and a gain stage. First and second terminals of the first resistor are coupled respectively to the first and second bonding pads. First and second terminals of the oscillation crystal module are coupled respectively to the first and second bonding pads. First and second terminals of the first capacitor are coupled respectively to the first bonding pad and a reference voltage source. First and second terminals of the second capacitor are coupled respectively to the second bonding pad and the reference voltage source. Input and output terminals of the gain stage are coupled respectively to the first and second bonding pads, wherein the gain stage comprises a plurality of amplifiers and a plurality of current-limiting resistors. Input terminals of the amplifiers are coupled together to the first bonding pad, wherein transconductances of the amplifiers are different from each other. First terminals of the plurality of current-limiting resistors are respectively coupled to output terminals of the plurality of amplifiers in a one-on-one manner, and second terminals of the plurality of current-limiting resistors are coupled together to the second bonding pad.

In an embodiment of the invention, any of the amplifiers includes a switch unit and an inverter. A first terminal of the switch unit is coupled to the first bonding pad. An input terminal of the inverter is coupled to a second terminal of the switch unit, and an output terminal of the inverter is coupled to a first terminal of a corresponding current-limiting resistor among the plurality of current-limiting resistors.

In an embodiment of the invention, any of the amplifiers includes a first transmission gate, a second transmission gate, a first transistor and a second transistor. A first terminal of the first transmission gate is coupled to the first bonding pad. A first terminal of the second transmission gate is coupled to the first bonding pad. A first terminal of the first transistor is coupled to a first voltage source, a second terminal of the first transistor is coupled to a first terminal of a corresponding current-limiting resistor among the plurality of current-limiting resistors, and a control terminal of the first transistor is coupled to a second terminal of the first transmission gate. A first terminal of the second transistor is coupled to the second terminal of the first transistor, a second terminal of the second transistor is coupled to a second voltage source, and a control terminal of the second transistor is coupled to a second terminal of the second transmission gate.

In an embodiment of the invention, the gain stage further includes a first diode and a second diode. A cathode of the first diode is coupled to a first power rail, and an anode of the first diode is coupled to the second bonding pad. A cathode of the second diode is coupled to the second bonding pad, and an anode of the second diode is coupled to a second power rail.

In an embodiment of the invention, the gain stage further includes a first diode and a second diode. A cathode of the first diode is coupled to a first power rail, and an anode of the first diode is coupled to the first bonding pad. A cathode of the second diode is coupled to the first bonding pad, and an anode of the second diode is coupled to a second power rail.

In an embodiment of the invention, the crystal oscillation circuit further includes a second resistor, wherein a first terminal thereof is coupled to the second bonding pad, and a second terminal of the second resistor is coupled to the second terminal of the oscillation crystal module and the first terminal of the second capacitor.

An embodiment of the invention provides a method for designing the crystal oscillation circuit, including a plurality a plurality of steps below. First, a requirement is provided. A first simulation step is performed so that the crystal oscillation circuit performs a first simulation to obtain a first simulation result. Next, a transconductance of a gain stage of the crystal oscillation circuit is changed according to a relation between the requirement and the first simulation result. A second simulation step is performed so that the crystal oscillation circuit uses the transconductance to perform a second simulation to obtain a second simulation result. Then, a resistance value of a resistor of the crystal oscillation circuit is changed according to a relation between the requirement and the second simulation result.

An embodiment of the invention provides a gain stage of crystal oscillation circuit, including a substrate, a first N doped region, a plurality of first gates, a plurality of first P+ doped regions, a plurality of second P+ doped regions, a first P doped region, a plurality of second gates, a plurality of N+ doped regions, a plurality of second N+ doped regions and a plurality of metal wires. The substrate has at least a first zone and a second zone. The first N doped region is disposed in the first zone. The plurality of first gates are disposed parallel on the first N doped region. The plurality of first P+ doped regions are disposed in the first N doped region. The plurality of second P+ doped regions are disposed in the first N doped region, wherein the first P+ doped regions serve respectively as sources of a plurality of first transistors, the plurality of first gates serve respectively as gates of the first transistors, and the plurality of second P+ doped regions serve respectively as drains of the plurality of first transistors. The first P doped region is disposed in the second zone, wherein the first P doped region is parallel to the first N doped region. The plurality of second gates are disposed parallel on the first P doped region. The plurality of first N+ doped regions are disposed in the first P doped region. The plurality of second N+ doped regions are disposed in the first P doped region, wherein the plurality of first N+ doped regions serve respectively as sources of a plurality of second transistors, the plurality of second gates serve respectively as gates of the plurality of second transistors, and the plurality of second N+ doped regions serve respectively as drains of the plurality of second transistors. The plurality of metal wires are disposed parallel on the first N doped region and the first P doped region, wherein the metal wires are electrically coupled respectively to the drain of at least one corresponding first transistor among the plurality of first transistors and to the drain of at least one corresponding second transistor among the plurality of second transistors.

In an embodiment of the invention, the gain stage of crystal oscillation circuit further includes a second N doped region, a plurality of third gates, a plurality of third P+ doped regions, a plurality of fourth P+ doped regions, a second P doped region, a plurality of fourth gates, a plurality of third N+ doped regions and a plurality of fourth N+ doped regions. The second N doped region is disposed in the first zone and parallel to the first N doped region. The plurality of third gates are disposed parallel on the second N doped region. The plurality of third P+ doped regions are disposed in the second N doped region. The plurality of fourth P+ doped regions are disposed in the second N doped region, wherein the plurality of third P+ doped regions serve respectively as sources of a plurality of third transistors, and the plurality of fourth P+ doped regions serve respectively as drains of the plurality of third transistors. The second P doped region is disposed in the second zone and parallel to the first P doped region. The plurality of fourth gates are disposed parallel on the second P doped region. The plurality of third N+ doped regions are disposed in the second P doped region. The plurality of fourth N+ doped regions are disposed in the second P doped region. The plurality of third N+ doped regions serve respectively as sources of a plurality of fourth transistors, the plurality of fourth gates serve respectively as gates of a plurality of fourth transistors, and the plurality of fourth N+ doped regions serve respectively as drains of the plurality of fourth transistors. Herein, the plurality of metal wires are disposed parallel on the second N doped region and the second P doped region, wherein the metal wires are electrically coupled respectively to the drain of at least one corresponding third transistor among the plurality of third transistors and to the drain of at least one corresponding fourth transistor among the plurality of fourth transistors.

In an embodiment of the invention, the sources of the plurality of first transistors are coupled to a first voltage source, and the sources of the second transistors are coupled to a second voltage source.

In an embodiment of the invention, the gain stage of crystal oscillation circuit further includes a plurality of current-limiting resistors, disposed on the substrate, wherein first terminals of the plurality of current-limiting resistors are respectively coupled to the plurality of metal wires in a one-on-one manner, and second terminals of the plurality of current-limiting resistors are coupled together to a bonding pad.

In an embodiment of the invention, the gain stage of the crystal oscillation circuit further includes a first diode and a second diode. The first diode is disposed in the first zone, wherein a cathode of the first diode is coupled to a first power rail, and an anode of the first diode is coupled to the bonding pad. The second diode is disposed in the second zone, wherein a cathode of the second diode is coupled to the bonding pad, and an anode of the second diode is coupled to a second power rail.

Based on the above, a crystal oscillation circuit, a gain stage of the crystal oscillation circuit and a method for designing the same are disclosed in the embodiments of the invention. In the embodiments of the invention, a multi-level gain stage is provided via the plurality of amplifiers having different transconductances. Users may selectively enable (or disable) a portion or all of the amplifiers to flexibly select/set the gain stage of the crystal oscillation circuit so as to match drive levels of a quartz crystal. In addition, in the embodiments of the invention, the plurality of current-limiting resistors are coupled respectively to the output terminals of the amplifiers in a one-on-one manner, so as to protect the inner circuit of the gain stage of the crystal oscillation circuit by means of the current-limiting ability of the current-limiting resistors.

To make the above features and advantages of the present invention more comprehensible, several embodiments accompanied with drawings are described in detail as follows.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
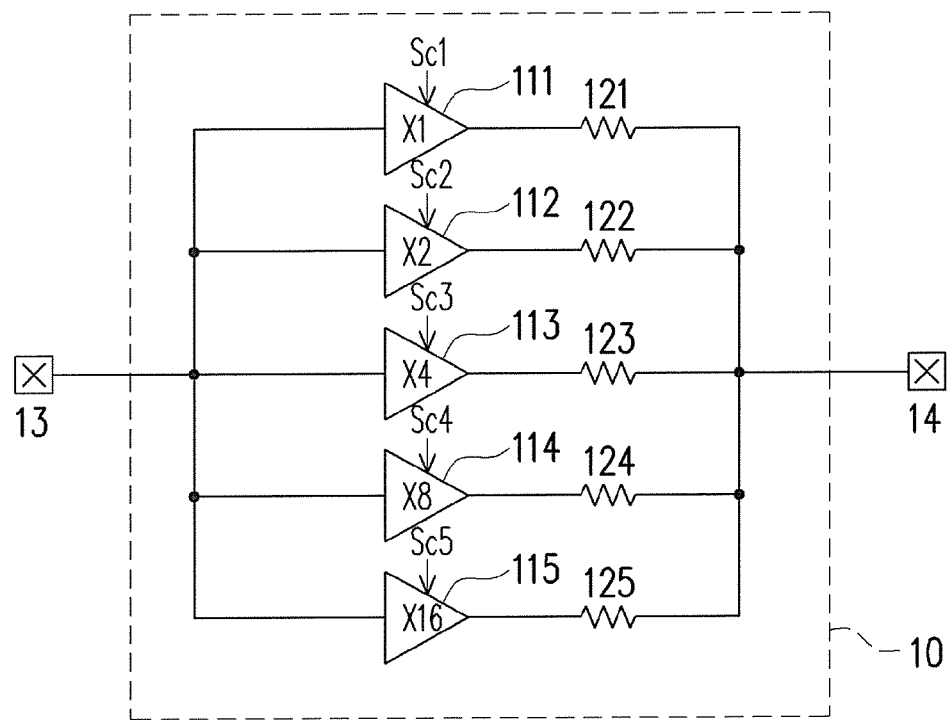
FIG. 1 is a schematic circuit diagram of a gain stage of a crystal oscillation circuit according to an embodiment of the invention.

Detailed descriptions of exemplary embodiments of the invention are now provided with reference to instances illustrated in the drawings. Moreover, wherever possible, elements/components/steps with identical reference numerals represent identical or similar parts in the drawings and embodiments.

FIG. 1 is a schematic circuit diagram of a gain stage of a crystal oscillation circuit according to an embodiment of the invention. Referring to FIG. 1, a gain stage 10 of the crystal oscillation circuit includes a plurality of amplifiers and a plurality of current-limiting resistors (in this embodiment, amplifiers 111-115 and current-limiting resistors 121-125 are taken as examples for description, but the invention is not limited thereto). It is worth noting that the amplifiers 111-115 respectively have different transconductances. In this embodiment, the transconductances of the amplifiers 111-115 are respectively shown by ×1, ×2, ×4, ×8 and ×16, but the invention is not limited thereto.

Figure 5:
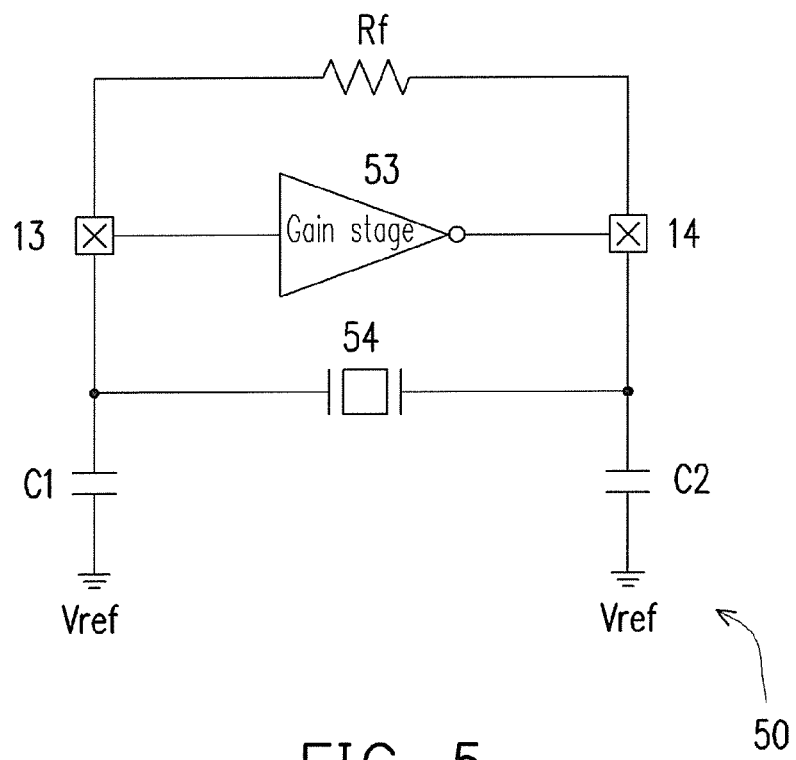
FIG. 5 is a schematic circuit diagram of a crystal oscillation circuit according to an embodiment of the invention.
Figure 6:
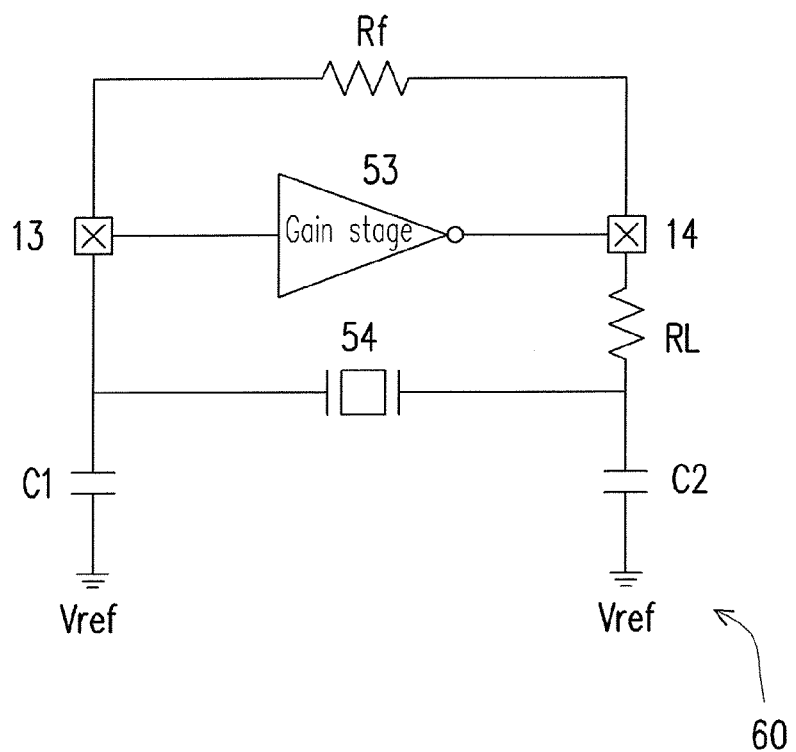
FIG. 6 is a schematic circuit diagram of a crystal oscillation circuit according to another embodiment of the invention.

In this embodiment, input terminals of the amplifiers 111-115 are coupled together to a first bonding pad 13. First terminals of the current-limiting resistors 121-125 are respectively coupled to output terminals of the amplifiers 111-115 in a one-on-one manner, and second terminals of the current-limiting resistors 121-125 are coupled together to a second bonding pad 14. The first bonding pad 13 and the second bonding pad 14 are respectively for being electrically coupled to first and second terminals of an oscillation crystal module (referring to relevant descriptions about an oscillation crystal module 54 as shown in FIGS. 5 and 6 for inference).

More specifically, drive levels of the gain stage 10 in the crystal oscillation circuit of this embodiment is divided into $2^5$ levels by means of the 5 amplifiers 111-115. Users may selectively enable (or disable) a portion or all of the amplifiers to flexibly select/set the gain stage of the drive levels of the gain stage 10 in the crystal oscillation circuit by means of control signals Sc1, Sc2, Sc3, Sc4 and Sc5. Therefore, the gain stage 10 of this crystal oscillation circuit is controlled by a control signal consisting of 5 bits. By changing the configurations of these control signals Sc1-Sc5 adequately, the gain stage 10 is able to provide $2^5$ transconductances (i.e. drivel levels). Referring to Table 1, Table 1 provides correspondences between the permutations-and-combinations of the control signals and the transconductances exemplified according to an embodiment of the invention.

TABLE 1 control signals and drive levels of gain stage 10

| Driving Level | Control Signal [Sc5:Sc1] | Transconductance |
|---|---|---|
| 0 | [00000] | ×0 |
| 1 | [00001] | ×1 |
| 2 | [00010] | ×2 |
| 3 | [00011] | ×1 + ×2 = ×3 |
| 4 | [00100] | ×4 |
| 5 | [00101] | ×1 + ×4 = ×5 |

TABLE 1-continued control signals and drive levels of gain stage 10

| Driving Level | Control Signal [Sc5:Sc1] | Transconductance |
|---|---|---|
| 6 | [00110] | ×2 + ×4 = ×6 |
| 7 | [00111] | ×1 + ×2 + ×4 = ×7 |
| 8 | [01000] | ×8 |
| 9 | [01001] | ×1 + ×8 = ×9 |
| ... | ... | ... |
| 31 | [11111] | ×1 + ×2 + ×4 + ×8 + ×16 = ×31 |

For instance, when the drive level selected by the user is 0, all of the amplifiers 111-115 are disabled by means of the control signals Sc1-Sc5. When the drive level selected by the user is 1, the amplifier 111 is enabled by means of the control signals Sc1-Sc5, but the rest amplifiers 112-115 remain disabled. When the drive level selected by the user is 3, the amplifiers 111 and 112 are enabled by means of the control signals Sc1-Sc5, but the rest amplifiers 113-115 remain disabled. Similarly, when he drive level selected by the user is 31, all of the amplifiers 111-115 are enabled by means of the control signals Sc1-Sc5. Thereby, by means of the control signals Sc1-Sc5 that control the plurality of amplifiers 111-115 having different transconductances, the drive levels of the gain stage 10 are divided into multiple levels. When the drive levels are divided into more levels, frequency intervals corresponding to each drive level are further reduced, which thereby enables the user to set optimization parameters flexibly according to the environment.

On the other hand, under the condition that no current-limiting resistors 121-125 are provided, considering the issue of electrostatic discharge (ESD) faced by output terminals of each of the amplifiers 111-115, output circuits of each of the amplifiers 111-115 need to be provided with transistors having large areas; however, the transistors having large areas occupy too much area in the crystal oscillation circuit. In this embodiment, the current-limiting resistors 121-125 are respectively coupled to output terminals of the amplifiers 111-115. When ESD occurs in the second bonding pad 14, the current-limiting resistors 121-125 are able to limit the current flow of an ESD current from the second bonding pad 14 to the amplifiers 111-115, so as to protect the inner circuit of the gain stage 10 from being burned out by the ESD current. Thereby, no consideration should be given to the ESD current, and transistors having small areas may be selected to be disposed in the amplifiers 111-115.

Figure 2:
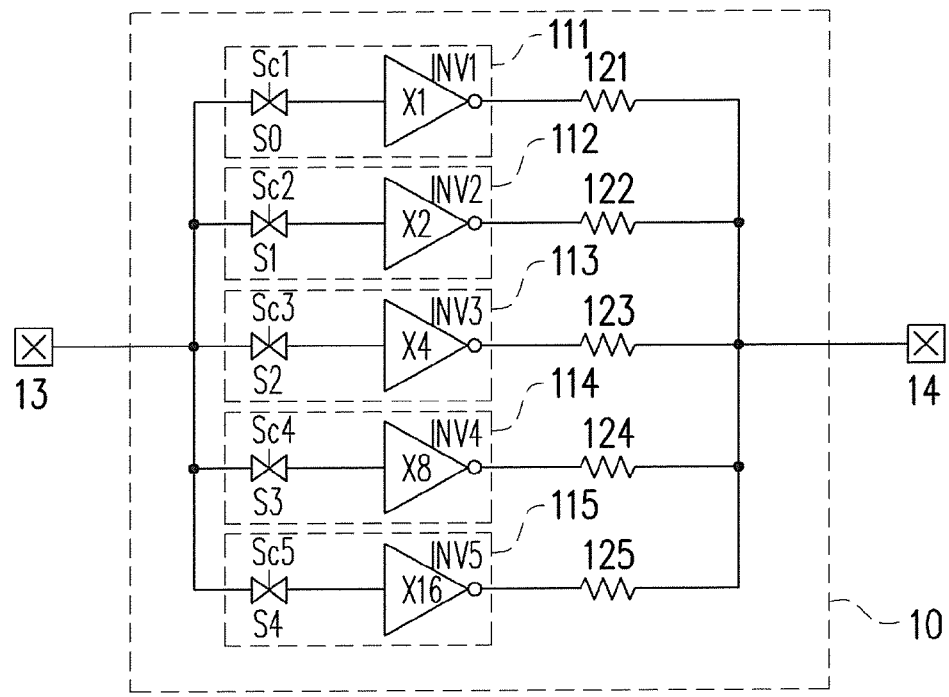
FIG. 2 is a schematic circuit diagram of the gain stage of the crystal oscillation circuit illustrated in FIG. 1 in an embodiment of the invention.

FIG. 2 is a schematic circuit diagram of the gain stage 10 of the crystal oscillation circuit illustrated in FIG. 1 in an embodiment of the invention. The gain stage 10, the amplifiers 111-115, the current-limiting resistors 121-125, the first bonding pad 13 and the second bonding pad 14 in the crystal oscillation circuit as shown in FIG. 2 may be referred in relevant descriptions about FIG. 1 and are not repeated herein. In the embodiment as shown in FIG. 2, the amplifiers 111-115 include respectively a switch unit and an inverter (in this embodiment, switch units S0-S4 and inverters INV1-INV5 are taken as examples for description, but the invention is not limited thereto), wherein the inverters INV1-INV5 respectively have different transconductances that queue from small to large and are shown by ×1, ×2, ×4, ×8 and ×16, but the invention is not limited thereto.

In this embodiment, first terminals of the switch units S0-S4 are all coupled to the first bonding pad 13. The switch units S0-S4 may be any type of switch circuit/element, such as a transmission gate, a transistor or other switch elements. Input terminals of the inverters INV1-INV5 are respectively coupled to a second terminal of a corresponding switch unit among the switch units S0-S4, and output terminals of the inverters INV1-INV5 are coupled respectively to a first terminal of a corresponding current-limiting resistor among the current-limiting resistors 121-125. Thereby, the switch units S0-S4 are able to control the inverters INV1-INV5, so as to provide a plurality of drive levels of the gain stage 10 of the crystal oscillation circuit. Therefore, the user is able to set optimization parameters of the crystal oscillation circuit flexibly according to the environment.

Figure 3:
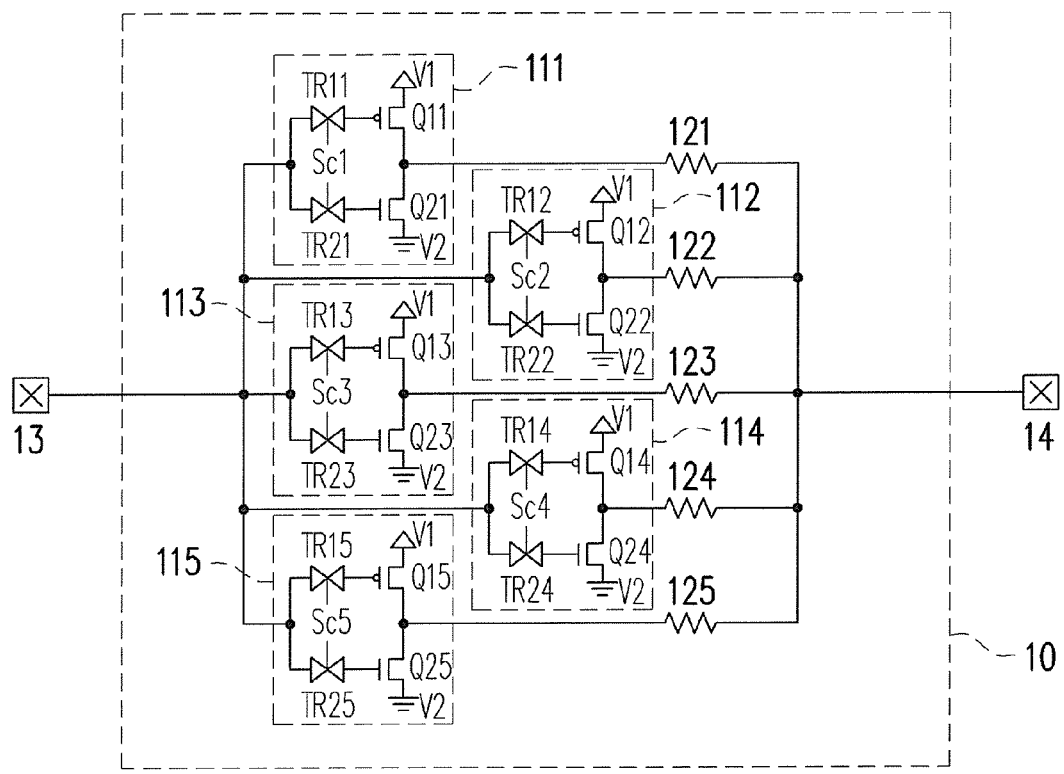
FIG. 3 is a schematic circuit diagram of the gain stage of the crystal oscillation circuit illustrated in FIG. 1 in another embodiment of the invention.

FIG. 3 is a schematic circuit diagram of the gain stage of the crystal oscillation circuit illustrated in FIG. 1 in another embodiment of the invention. In the gain stage 10 of the crystal oscillation circuit as shown in FIG. 3, the amplifiers 111-115, the current-limiting resistors 121-125, the first bonding pad 13 and the second bonding pad 14 may be referred in relevant descriptions about FIG. 1 and are not repeated herein. In the embodiment as shown in FIG. 3, the amplifiers 111-115 may respectively include a first transmission gate, a second transmission gate, a first transistor and a second transistor (in this embodiment, first transmission gates TR11-TR15, second transmission gates TR21-TR25, first transistors Q11-Q15 and second transistors Q21-Q25 are taken as examples for description, but the invention is not limited thereto). The first transistors Q11-Q15 are PMOS transistors and respectively have different transconductances while the second transistors Q21-Q25 are NMOS transistors and respectively have different transconductances, but the invention is not limited thereto.

First terminals of the first transmission gates TR11-TR15 and second transmission gates TR21-TR25 are all coupled to the first bonding pad 13. First terminals (such as source gates) of the first transistors Q11-Q15 are all coupled to a first voltage source V1. Second terminals (such as drains) of the first transistors Q11-Q15 are coupled respectively to a first terminal of a corresponding current-limiting resistor among the current-limiting resistors 121-125. For instance, the drain of the first transistor Q11 is coupled to the first terminal of the current-limiting resistor 121, and the drain of the first transistor Q15 is coupled to the first terminal of the current-limiting resistor 125. Control terminals (such as gates) of the first transistors Q11-Q15 are coupled respectively to a second terminal of a corresponding first transmission gate among the first transmission gates TR11-TR15. For instance, the gate of the first transistor Q11 is coupled to the second terminal of the first transmission gate TR11, and the drain of the first transistor Q15 is coupled to the second terminal of the first transmission gate TR15. First terminals (such as drains) of the second transistors Q21-Q25 are coupled respectively to a second terminal of a corresponding first transistors among the first transistors Q11-Q15. For instance, the drain of the second transistor Q21 is coupled to the drain of the first transistor Q11, and the drain of the second transistor Q25 is coupled to the drain of the first transistor Q15. Second terminals (such as source gates) of the second transistors Q21-Q25 are all coupled to a second voltage source V2. Control terminals (such as gates) of the second transistors Q21-Q25 are coupled respectively to a second terminal of a corresponding second transmission gate among the second transmission gates TR21-TR25. For instance, the gate of the second transistor Q21 is coupled to the second terminal of the second transmission gate TR21, and the gate of the second transistor Q25 is coupled to the second terminal of the second transmission gate TR25.

Herein, the first voltage source V1 is, for example, a system voltage source, and the second voltage source V2 is, for example, a ground voltage source; however, the first voltage source V1 and the second voltage source V2 are not limited in this embodiment. In this embodiment, the first transistors Q11-Q15 may be controlled respectively by the first transmission gates TR11-TR15, the second transistors Q21-Q25 may be controlled respectively by the second transmission gates TR21-TR25, and thereby the gain stage 10 of the crystal oscillation circuit is able to provide the plurality of drive levels by means of control via the first transmission gates TR11-TR15 and the second transmission gates TR21-TR25. Therefore, the user is able to set optimization parameters of the crystal oscillation circuit flexibly according to the environment.

Figure 4:
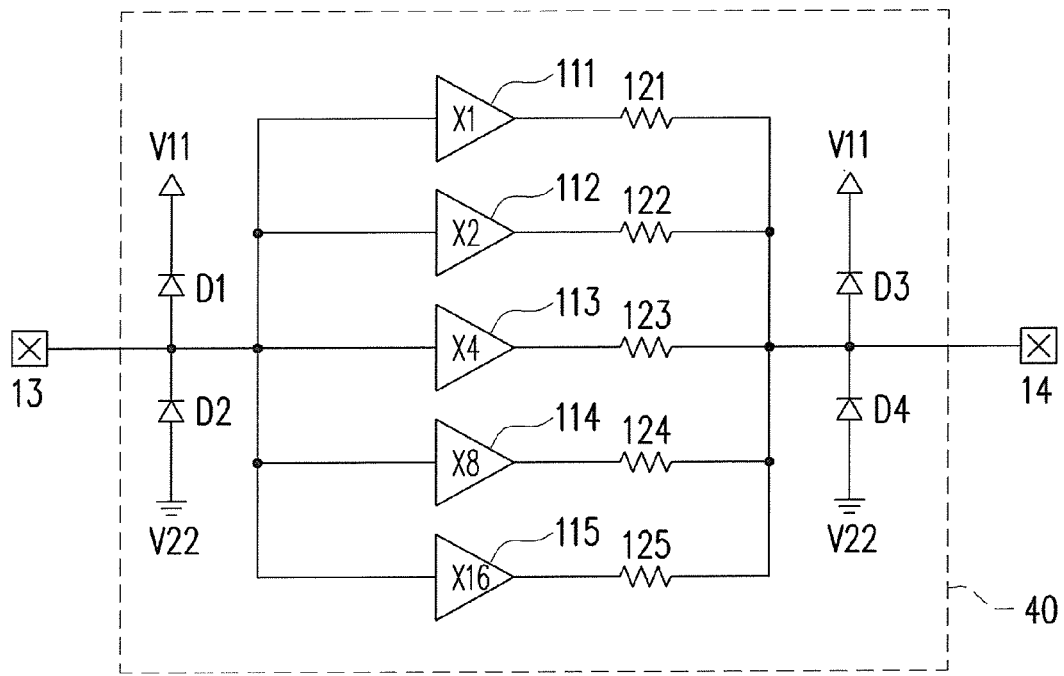
FIG. 4 is a schematic circuit diagram of a gain stage of a crystal oscillation circuit according to another embodiment of the invention.

FIG. 4 is a schematic circuit diagram of a gain stage 40 of a crystal oscillation circuit according to another embodiment of the invention. A gain stage 40, amplifiers 111-115, current-limiting resistors 121-125, a first bonding pad 13 and a second bonding pad 14 in the crystal oscillation circuit as shown in FIG. 4 may be referred and inferred in relevant descriptions about the gain stage 10, the amplifiers 111-115, the current-limiting resistors 121-125, the first bonding pad 13 and the second bonding pad 14 as shown in FIG. 1 and are not repeated herein.

In the embodiment as shown in FIG. 4, the gain stage 40 further includes a diode D1, a diode D2, a diode D3 and a diode D4. A cathode of the diode D1 is coupled to first power rails V11. An anode of the diode D1 is coupled to the first bonding pad 13. A cathode of the diode D2 is coupled to the first bonding pad 13. An anode of the diode D2 is coupled to second power rails V22. A cathode of the diode D3 is coupled to first power rails V11. An anode of the diode D3 is coupled to the second bonding pad 14. A cathode of the diode D4 is coupled to the second bonding pad 14. An anode of the diode D4 is coupled to second power rails V22. It should be noted that the voltage of the first power rails V11 as shown in FIG. 4 may be equivalent to the voltage of the first voltage source V1 as shown in FIG. 3 or different from the voltage of the first voltage source V1, and the voltage of the second power rails V22 as shown in FIG. 4 may be equivalent to the voltage of the second voltage source V2 as shown in FIG. 3 or different from the voltage of the second voltage source V2. The invention does not limit thereon.

When a positive ESD pulse occurs in the first bonding pad 13, the positive ESD pulse is led into the first power rails V11 via the diode D1. When a negative ESD pulse occurs in the first bonding pad 13, the negative ESD pulse is led into the second power rails V22 via the diode D2. Similarly, to the second bonding pad 14, the diode D3 and the diode D4 may lead the ESD pulse in the second bonding pad 14 into the power rails V11 or V22.

The plurality of current-limiting resistors 121-125 are provided in the gain stage 40 of this embodiment. When ESD occurs in the second bonding pad 14, the current-limiting resistors 121-125 are able to limit the current flow of an ESD current from the second bonding pad 14 to the amplifiers 111-115, so as to protect the inner circuit of the gain stage 40 from being burned out by the ESD current.

FIG. 5 is a schematic circuit diagram of a crystal oscillation circuit 50 according to an embodiment of the invention. The crystal oscillation circuit 50 includes a first bonding pad 13, a second bonding pad 14, a gain stage 53, an oscillation crystal module 54, a first resistor Rf, a first capacitor C1 and a second capacitor C2, wherein the oscillation crystal module 54 is, for example, a quartz crystal, but the invention is not limited thereto. The gain stage 10 or 40 in the embodiments as shown in FIGS. 1-4 may be applied to the gain stage 53 of the crystal oscillation circuit 50 as shown in FIG. 5. The implementing details of the gain stage 53 as shown in FIG. 5 may be referred in relevant descriptions about the gain stage 10 or 40 as shown in FIGS. 1-4 and are not repeated herein.

In the embodiment as shown in FIG. 5, the first resistor Rf is coupled in parallel with the gain stage 53 and the oscillation crystal module 54 (that is, the first resistor Rf, the gain stage 53 and the oscillation crystal module 54 are coupled in parallel between the first bonding pad 13 and the second bonding pad 14). The first capacitor C1 is coupled between the first bonding pad 13 and a reference voltage source Vref, and the second capacitor C2 is coupled between the second bonding pad 14 and a reference voltage source Vref, wherein the reference voltage sources Vref are, for example, ground voltage sources, but the invention is not limited thereto. The first capacitor C1 and the second capacitor C2 provides a load to the oscillation crystal module 54 for the need of parallel resonance. It is worth noting that the gain stage 10 or the gain stage 40 as shown in FIGS. 1-4 are applied to the gain stage 53 in FIG. 5, and the gain stage 53 can provide a plurality of transconductances for system requirement by controlling the gain stage 53 so as to provide a more accurate driving level. Thereby, the crystal oscillation circuit 50 is able to set optimization parameters flexibly according to the environment.

It is worth noting that in other embodiments, additional current-limiting resistor may be further incorporated in the crystal oscillation circuit 50. For instance, FIG. 6 is a schematic circuit diagram of a crystal oscillation circuit 60 according to another embodiment of the invention. The crystal oscillation circuit 60 includes a first bonding pad 13, a second bonding pad 14, a gain stage 53, an oscillation crystal module 54, a first resistor Rf, a second resistor RL, a first capacitor C1 and a second capacitor C2. The crystal oscillation circuit 60, the first bonding pad 13, the second bonding pad 14, the gain stage 53, the oscillation crystal module 54, the first resistor Rf, the first capacitor C1 and the second capacitor C2 as shown in FIG. 6 may be referred and inferred in relevant descriptions about the crystal oscillation circuit 50, the first bonding pad 13, the second bonding pad 14, the gain stage 53, the oscillation crystal module 54, the first resistor Rf, the first capacitor C1 and the second capacitor C2 as shown in FIG. 5 and are not repeated herein.

A primary difference from FIG. 5 lies in that a first terminal of the second resistor RL is coupled to the second bonding pad 14, and a second terminal of the second resistor RL is coupled to the second terminal of the oscillation crystal module 54 and the first terminal of the second capacitor C2. The second resistor RL serves the function of a current-limiting resistor. Thereby, in addition to providing more suitable transconductances by controlling the gain stage 53, the designer may also adjust the optimization parameter of the crystal oscillation circuit 60 by adjusting a resistance value of the second resistor RL.

Figure 7:
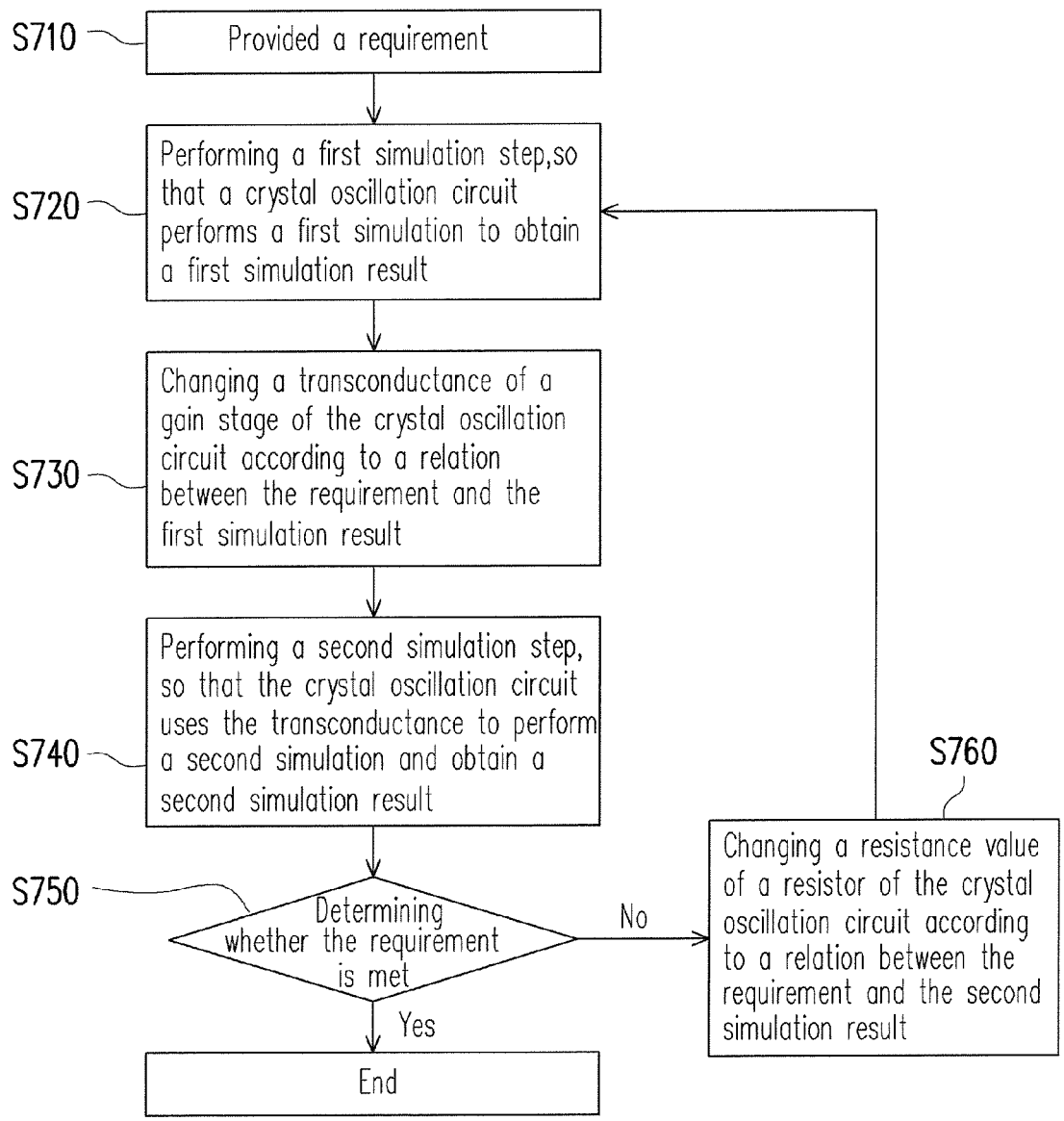
FIG. 7 is a schematic flowchart of a method for designing a crystal oscillation circuit according to an embodiment of the invention.

FIG. 7 is a schematic flowchart of a method for designing a crystal oscillation circuit according to an embodiment of the invention. Referring to both FIGS. 6 and 7, the method for designing the crystal oscillation circuit of the embodiment is adapted for use in the crystal oscillation circuit 60 of FIG. 6. A requirement is provided in a step S710, and this requirement may be a requirement for designing products. More specifically, the requirement provided in the step S710 may include operating conditions and static characteristics. The operating conditions are, for example, settings such as power and operating temperature ranges of driving levels while the static characteristics may be, for example, nominal frequency, frequency tolerance, equivalent serial resistance value, parallel capacitance value or insulation resistance value, etc. The invention is not limited thereto.

Figure 8A:
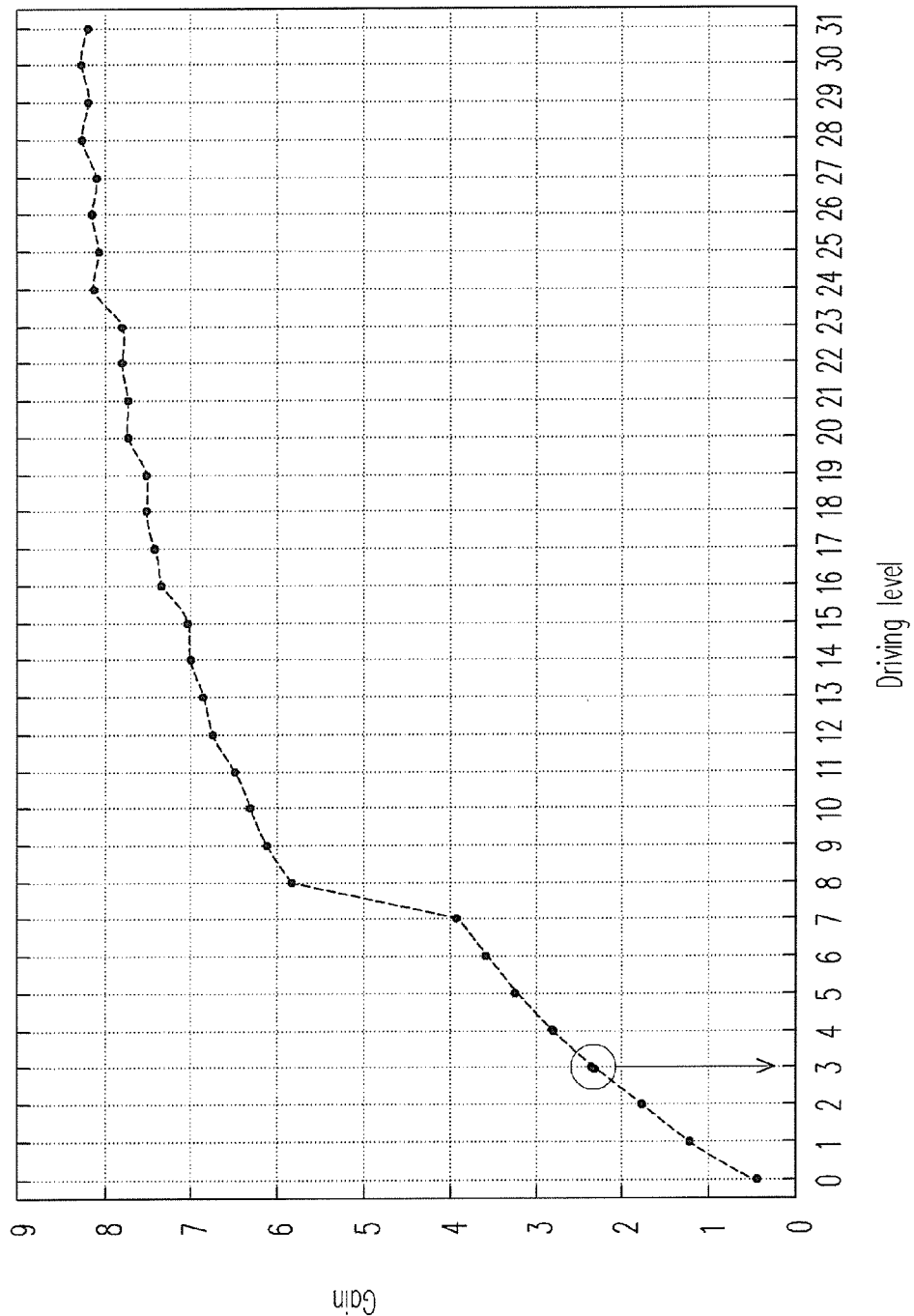
FIG. 8A is a schematic diagram simulating a crystal oscillation circuit according to an embodiment of the invention.

A first simulation step is performed in a step S720 so that the crystal oscillation circuit 60 performs a first simulation (such as a direct current simulation) to obtain a first simulation result. In this embodiment, simulation may be performed based on the requirements of the operating conditions and static characteristics provided by the user. For instance (but not limited thereto), a result of performing the first simulation on the crystal oscillation circuit 60 may be referred in FIG. 8A. FIG. 8A is a schematic diagram simulating a crystal oscillation circuit according to an embodiment of the invention. The horizontal axis as shown in FIG. 8A represents driving levels of a gain stage 53, and the vertical axis represents gain values of the gain stage 53. Since the gain stage 53 of the crystal oscillation circuit 60 in this embodiment may have a plurality of driving levels (such as 2^5 stages of driving levels), the gain stage 53 of the crystal oscillation crystal circuit 60 is able to provide 2^5 transconductances (or 2^5 gain values). As shown by the horizontal axis in FIG. 8A, integers 0-31 are used in this embodiment to represent different driving levels of the gain stage 53. After performing the first simulation, a relation curve of driving levels 0-31 of the crystal oscillation circuit 60 and the gain values are known and shown in FIG. 8A.

In a step S730, a transconductance of the gain stage 53 of the crystal oscillation circuit 60 is correspondingly changed according to a relation between the requirement provided in the step S710 and the first simulation result in the step S720. In the step S730 of this embodiment, a suitable driving level may be automatically selected according to the result of simulation as shown in FIG. 8A and the requirement provided in the step S710. For instance, if the requirement provided in the step S710 directs that the gain value required by the crystal oscillation circuit 60 is 2, a driving level 3 may be selected from the curve as shown in FIG. 8A as a driving level of the gain stage 53 of the crystal oscillation circuit 60 in the step S730 because the gain value of the driving level 3 is greater than 2 and closest to 2.

In a step S740, a second simulation step is performed, so that the crystal oscillation circuit uses the transconductance (driving level) selected in the step S730 to perform a second simulation (such as a transient simulation) and obtain a second simulation result. In this embodiment, the second simulation result may include the power corresponding to the driving level selected in the step S730.

In a step S750, it may be determined whether the power (i.e. the simulation result in the step S740) corresponding to the driving level selected in the step S730 meets the requirement provided in the step S710. In this embodiment, if the result of determination in the step S750 shows that the power corresponding to the driving level selected in the step S730 is smaller than the requirement provided in the step S710 (that is, the simulation result in the step S740 has met the requirement provided in the step S710), all the processes in FIG. 7 are ended. That is, when the power of the crystal oscillation circuit 60 meets the requirement provided in the step S710, this is the most preferable arrangement of driving levels (i.e. optimization parameters have been completed). If the power corresponding to the driving level selected in the step S730 is greater than the requirement provided in the step S710 (which means that the current parameter of the crystal oscillation circuit 60 has not met the requirement provided in the step S710), a step S760 is performed.

For instance, if the requirement provided in the step S710 directs that a maximum power is 10 μW and the simulation result of the step S740 shows that the power of the crystal oscillation circuit 60 is 174 μW, the step S760 needs to be performed.

According to a relation between the requirement provided in the step S710 and the second simulation result in the step S740, a resistance value of a resistor of the crystal oscillation circuit 60 may be changed in the step S760. In this embodiment, if the power of the crystal oscillation circuit 60 does not meet the requirement provided in the step S710, a resistance value of a second resistor RL may be changed in the step S760 (i.e. enhancing the resistance value of the second resistor RL). After completing the step S760, the steps S720-S750 are performed again until the determined result of the step S750 shows that the simulation result in the step S740 has met the requirement provided in the step S710.

Figure 8B:
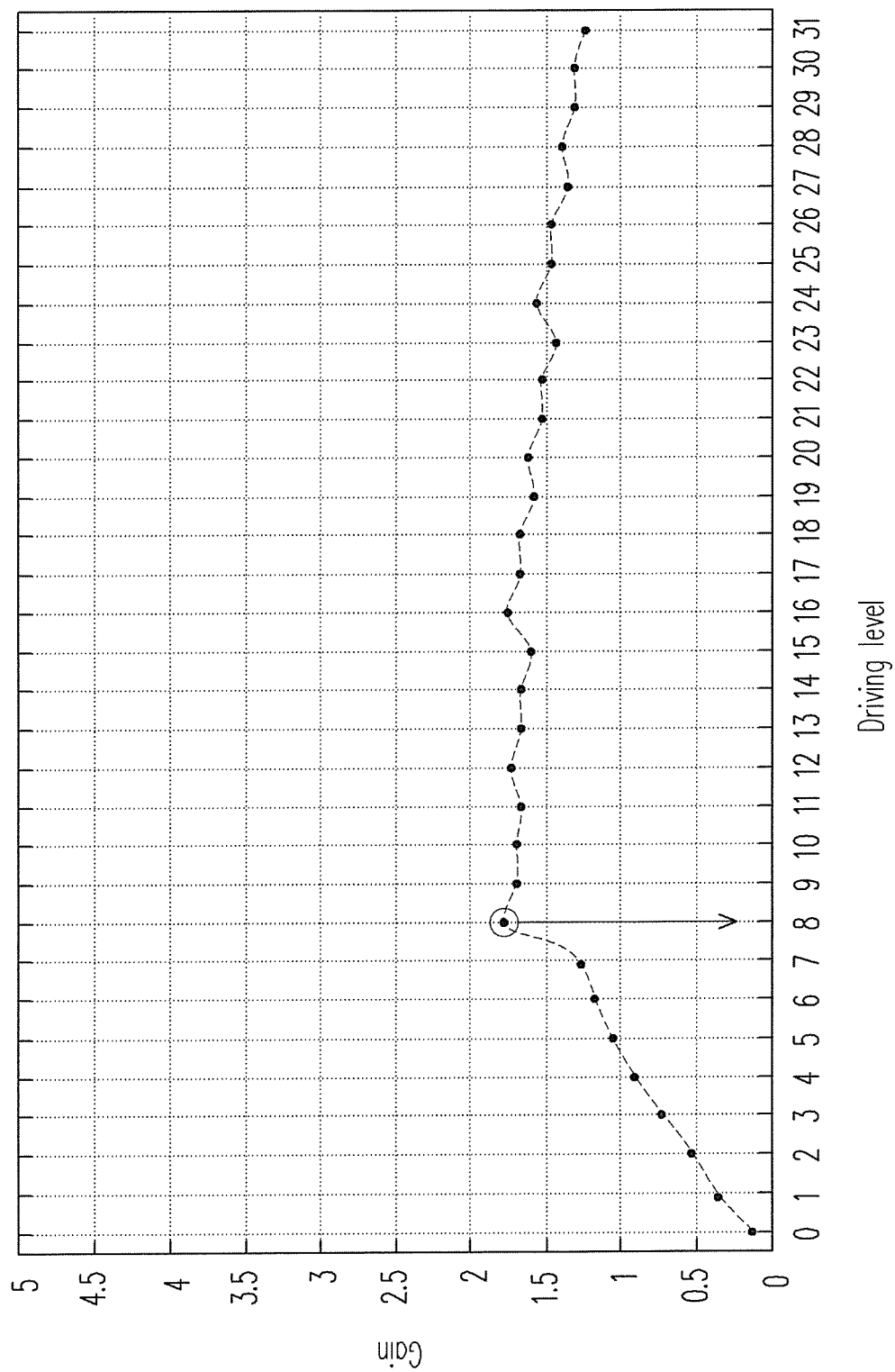
FIG. 8B is a schematic diagram simulating a crystal oscillation circuit according to another embodiment of the invention.

For instance, after completing the step S760, the step S720 is performed again to obtain a new simulation result (as shown in FIG. 8B). FIG. 8B is a schematic diagram simulating the crystal oscillation circuit 60 according to another embodiment of the invention. The horizontal axis as shown in FIG. 8B represents driving levels of the gain stage 53, and the vertical axis represents gain values of the gain stage 53. After changing the resistance value of the second resistor RL, a new relation curve of the driving levels 0-31 of the crystal oscillation circuit 60 and the gain values are shown in FIG. 8B. According to the simulation result as shown in FIG. 8B and the requirement provided in the step S710, a suitable driving level may be selected in the step S730. In this embodiment, since the requirement provided in the step S710 directs that the gain value required by the crystal oscillation circuit 60 is 2, a driving level 8 may be selected from the curve as shown in FIG. 8B as a new driving level of the crystal oscillation circuit 60 in the step S730 because the gain value of the driving level 8 is closest to 2. In the step S740, the driving level 8 selected in the step S730 is used to perform a second simulation again, and it is obtained that the power of the crystal oscillation circuit 60 is 9.62 μW. Since the power of the crystal oscillation circuit 60 is smaller than or equal to the requirement 10 μW provided in the step S710, this means that the power of the crystal oscillation circuit 60 has met the requirement. Therefore, it is determined in the step S750 that the processing steps as shown in FIG. 7 may be ended, and the most preferable arrangement of the crystal oscillation circuit 60 is obtained simultaneously.

In brief, the crystal oscillation circuit 60 in the embodiment of the invention may perform an initial simulation based on the requirement provided by the step S710 to select the suitable driving level. When performing simulation based on the selected driving level, if the power of the crystal oscillation circuit 60 is still greater than the requirement, the resistance value of an additional resistor (such as the second resistor RL) of the crystal oscillation circuit 60 may further be changed in the step S760, and a suitable driving level is selected again to perform simulation so as to optimize the power and other parameters of the crystal oscillation circuit 60.

Figure 9A:
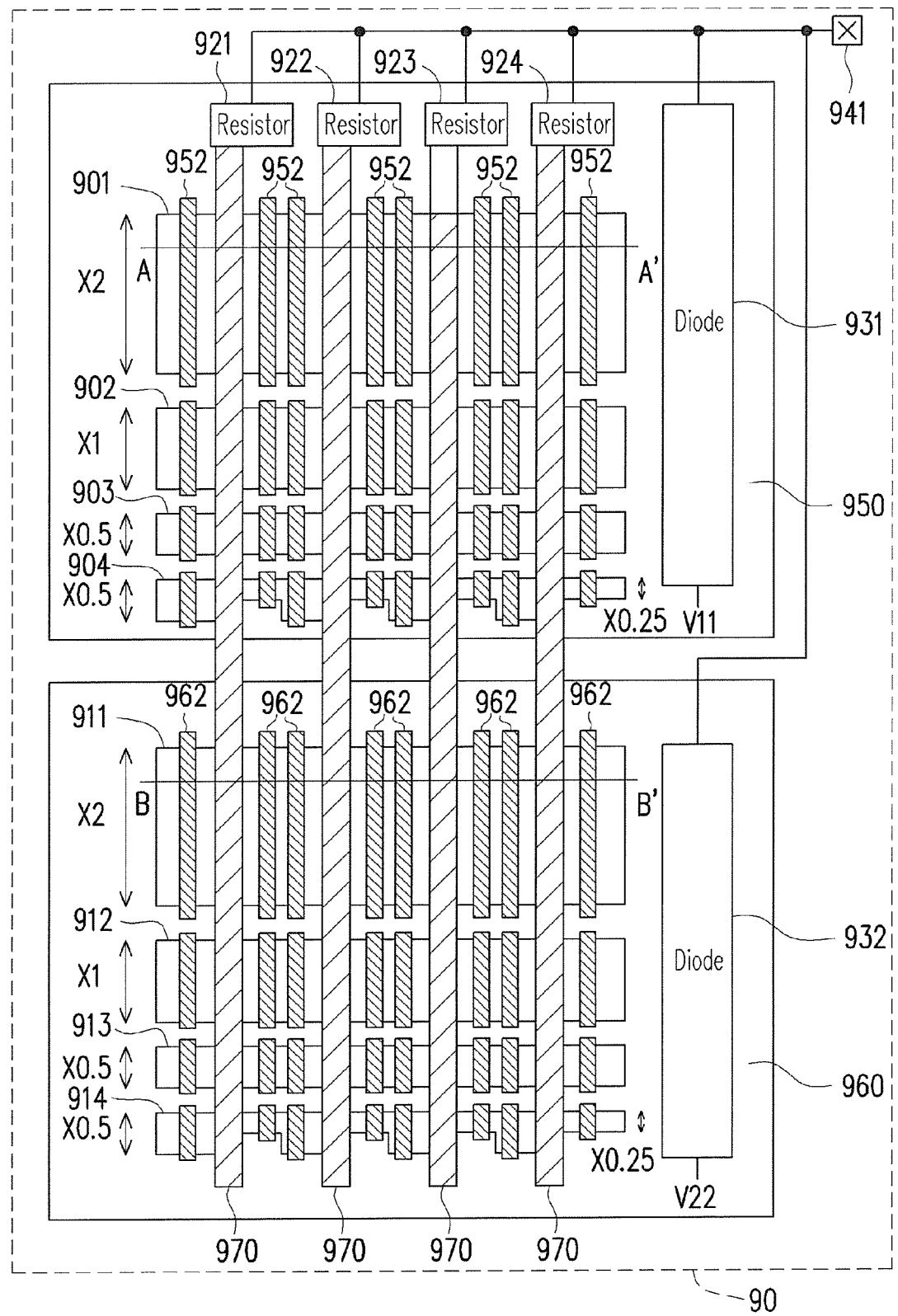
FIG. 9A is a schematic circuit layout diagram of the gain stage of the crystal oscillation circuit as shown in FIG. 4 according to an embodiment of the invention.

FIG. 9A is a schematic circuit layout diagram of the gain stage of the crystal oscillation circuit as shown in FIG. 4 according to an embodiment of the invention. Referring to FIG. 9A, a gain stage 90 of the crystal oscillation circuit of FIG. 9A includes a plurality of PMOS transistor sets 901-904, a plurality of NMOS transistor sets 911-914, current-limiting resistors 921-924, diodes 931-932, a bonding pad 941, a first zone 950 of a substrate, a second zone 960 and a plurality of metal wires 970 of the substrate, wherein the plurality of PMOS transistor sets 901-904, the current-limiting resistors 921-924 and the diode 931 are disposed in the first zone 950 of the substrate while the plurality of NMOS transistor sets 911-914 and the diode 932 are disposed in the second zone 960 of the substrate.

In addition, the plurality of PMOS transistor sets 901-904 and the plurality of NMOS transistor sets 911-914 may be serially coupled via the plurality of metal wires 970 to form a plurality of amplifier sets. It should be noted that the plurality of amplifier sets formed by the plurality of PMOS transistor sets 901-904 and the plurality of NMOS transistor sets 911-914 are equivalent to the amplifiers 111-115 as shown in FIG. 4, the current-limiting resistors 921-924 are equivalent to the current-limiting resistors as shown in FIG. 4, and the diodes 931-932 are equivalent to the diodes D3 and D4 as shown in FIG. 4.

In this embodiment, the amplifier sets formed by the plurality of PMOS transistor sets 901-904 and the plurality of NMOS transistor sets 911-914 are represented respectively by transistors having different areas, so as to realize the different transconductances that the amplifier sets have. For instance, the area (or channel width) of the first PMOS transistor set 901 is twice that of the second PMOS transistor set 902 (represented by "×2" in FIG. 9A), so the transconductance that the first PMOS transistor set 901 has is twice that of the second PMOS transistor set 902. The area (or channel width) of the third PMOS transistor set 903 is 0.5 times that of the second PMOS transistor set 902 (represented by "×0.5" in FIG. 9A), so the transconductance that the third PMOS transistor set 903 has is 0.5 times that of the second PMOS transistor set 902. The area (or channel width) that a portion of the fourth PMOS transistor set 904 has is 0.25 times that of the second PMOS transistor set 902 (represented by "×0.25" in FIG. 9A), so the transconductance that the fourth PMOS transistor set 904 has is 0.25 times that of the second PMOS transistor set 902. The proportion of the transconductances that each NMOS transistor set has may be inferred in the same way and is not repeated herein.

Figure 9B:
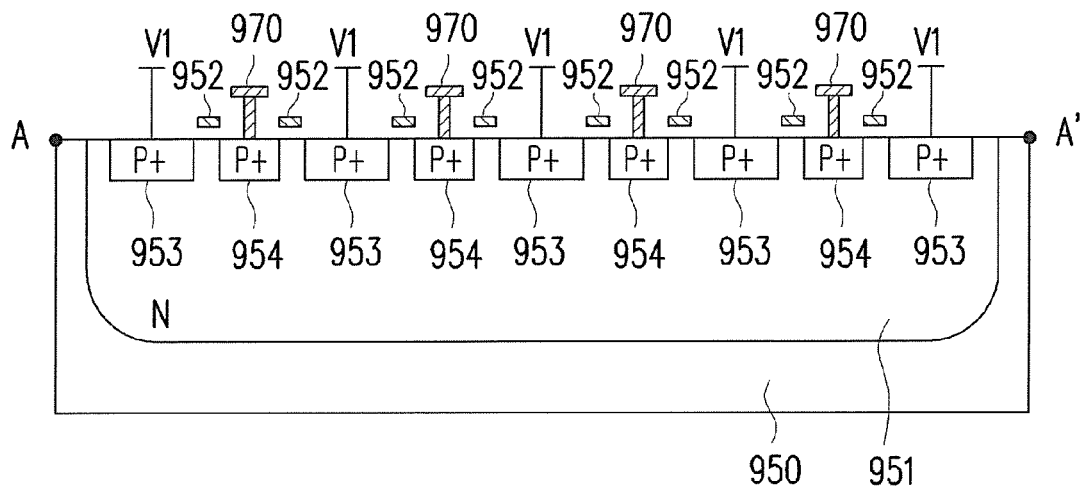
FIG. 9B is a schematic cross-section view of the gain stage of the crystal oscillation circuit of FIG. 9A along a sectional line A-A'.

FIG. 9B is a schematic cross-section view of the PMOS transistor 901 in the gain stage 90 of the crystal oscillation circuit in FIG. 9A along a sectional line A-A'. Other PMOS transistors 902-904 in the gain stage 90 may be referred by inference to relevant descriptions about the PMOS transistor 901 and are not repeated herein. The structure of FIG. 9B includes the first zone 950, a first N doped region 951, a plurality of first gates 952, a plurality of first P+ doped regions 953 and a plurality of second P+ doped regions 954. Referring to FIGS. 9A and 9B, the first N doped region 951 is disposed in the first zone 950 of the substrate. The first N doped region 951 may be a N doped semiconductor of a N-well, a deep N-well, a N substrate or other types. The plurality of first gates 952 are disposed parallel on the first N doped region 951. The plurality of first P+ doped regions 953 are disposed in the first N doped region 951, and the plurality of second P+ doped regions 954 are also disposed in the first N doped region 951. The first P+ doped region 953 does not contact the second P+ doped region 954.

It should be noted that the plurality of first P+ doped regions 953 serve respectively as sources of a plurality of PMOS transistors in the first PMOS transistor set 901, the plurality of first gates 952 serve respectively as gates of a plurality of PMOS transistors in the first PMOS transistor set 901, and the plurality of second P+ doped regions 954 serve respectively as drains of a plurality of PMOS transistors in the first PMOS transistor set 901. The sources (the first P+ doped regions 953) of the PMOS transistors may be electrically coupled to a first voltage source V1. The first voltage source V1 is, for example, a system voltage source or other power supply voltage sources, but the embodiment is not limited thereto. The gates (the first gates 952) of the PMOS transistors may be electrically coupled to a second terminal of a corresponding transmission gate (referring by inference to relevant descriptions in FIG. 3). The drains (the second P+ doped regions 954) of the PMOS transistors may be electrically coupled to a corresponding metal wire among the metal wires 970.

Figure 9C:
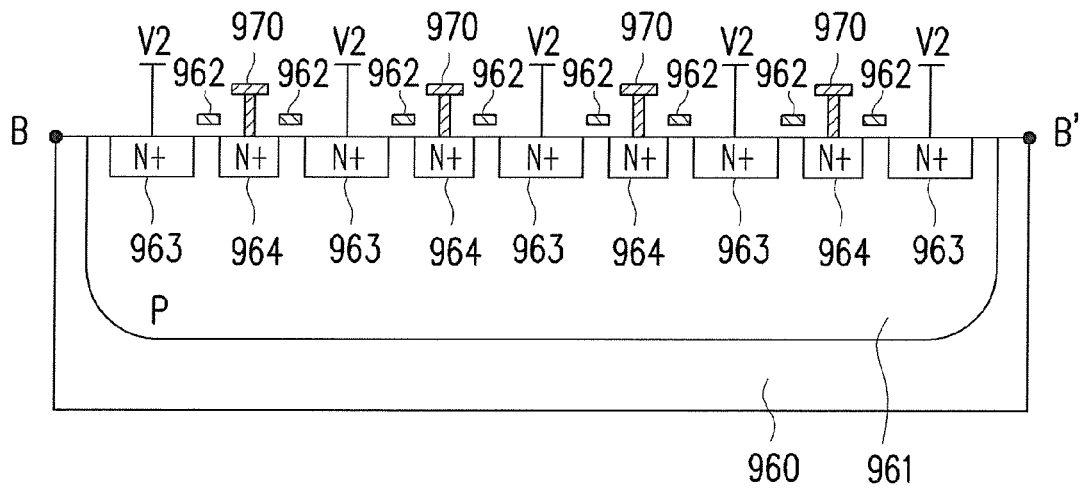
FIG. 9C is a schematic cross-section view of the gain stage of the crystal oscillation circuit of FIG. 9A along a sectional line B-B'.

FIG. 9C is a schematic cross-section view of the NMOS transistor 911 in the gain stage 90 of the crystal oscillation circuit in FIG. 9A along a sectional line B-B'. Other NMOS transistors 912-914 in the gain stage 90 may be referred by inference to relevant descriptions about the NMOS transistor 911 and are not repeated herein. The structure of FIG. 9C includes the second zone 960, a first P doped region 961, a plurality of second gates 962, a plurality of first N+ doped regions 963 and a plurality of second N+ doped regions 964. Referring to FIGS. 9A and 9C, the first P doped region 961 is disposed in the second zone 960 of the substrate. The first P doped region 961 may be a P doped semiconductor of a P-well, a PN-well, a P substrate or other types. The plurality of second gates 962 are disposed parallel on the first P doped region 961. The plurality of first N+ doped regions 963 are disposed in the first P doped region 961. The plurality of second N+ doped regions 964 are also disposed in the first P doped region 961. The first N+ doped region 963 does not contact the second N+ doped region 964.

It should be noted that the plurality of first N+ doped regions 963 serve respectively as sources of a plurality of NMOS transistors in the first NMOS transistor set 911 as shown in FIG. 9A, the plurality of second gates 962 serve respectively as gates of a plurality of NMOS transistors in the first NMOS transistor set 911, and the plurality of second N+ doped regions 964 serve respectively as drains of a plurality of NMOS transistors in the first NMOS transistor set 911. The sources (the first N+ doped regions 963) of the NMOS transistors may be electrically coupled to a second voltage source V2. The second voltage source V2 is, for example, a grounded voltage source or other reference voltage sources, but the embodiment is not limited thereto. The gates (the first gates 962) of the NMOS transistors may be electrically coupled to a second terminal of a corresponding transmission gate (referring by inference to relevant descriptions in FIG. 3). The drains (the second N+ doped regions 964) of the NMOS transistors may be electrically coupled to a corresponding metal wire among the metal wires 970.

The plurality of PMOS transistors and the plurality of NMOS transistors as shown in FIGS. 9B and 9C are serially coupled by the plurality of metal wires as shown in FIG. 9A. The plurality of metal wires 970 are disposed parallel on the first N doped region 951 and the first P doped region 961, wherein the metal wires are electrically coupled respectively to the drain of at least one corresponding PMOS transistor in the first PMOS transistor set 901 and electrically coupled respectively to the drain of at least one corresponding NMOS transistor in the first NMOS transistor set 911. Thereby, in this embodiment, the plurality of PMOS transistors and the plurality of NMOS transistors are electrically coupled by the plurality of metal wires 970, so as to form the plurality of amplifier sets.

Referring again to FIG. 9A, after the plurality of PMOS transistor sets 901-904 and the plurality of NMOS transistor sets 911-914 are serially coupled by the plurality of metal wires 970, the plurality of metal wires 970 are respectively coupled to first terminals of the plurality of current-limiting resistors 921-924 in a one-on-one manner, and second terminals of the plurality of current-limiting resistors 921-924 are coupled together to the bonding pad 941. The bonding pad 941 may be inferred with reference to descriptions about the bonding pad 14 as shown in FIGS. 1 to 6. The bonding pad 941 is further coupled to diodes 931 and 932. The diodes 931 and 932 may be inferred with reference to descriptions about the diodes D3 and D4 as shown in FIG. 4. The diode 931 is disposed in the first zone 950 of the substrate, and the diode 932 is disposed in the second zone 960 of the substrate.

Therefore, in this embodiment, the plurality of amplifier sets having different transconductances are formed by disposing the plurality of PMOS transistors 901-904 and the plurality of NMOS transistors 911-914, the driving level of the gain stage 90 of the crystal oscillation circuit may be divided into multiple sections to provide a more accurate transconductance, so as to set the optimization parameter flexibly according to the environment. In addition, the plurality of current-limiting resistors 921-924 in this embodiment are able to restrict the amount of ESD current flowing from the bonding pad 941 to the plurality of PMOS transistors 901-904 and the plurality of NMOS transistors 911-914, so as to protect the plurality of PMOS transistor sets 901-904 and the plurality of NMOS transistor sets 911-914 from being burned down by the ESD current to achieve the effect of ESD protection.

In view of the above, the crystal oscillation circuit, the gain stage of the crystal oscillation circuit and the method for designing the same are disclosed in the embodiments of the invention. In the embodiments of the invention, multi-level gain values are provided via the plurality of amplifiers having different transconductances. The system (or the user) may selectively enable (or disable) a portion or all of the amplifiers to flexibly select/set the driving level of the gain stage of the crystal oscillation circuit. In addition, in the embodiments of the invention, the plurality of current-limiting resistors are coupled respectively to the output terminals of the amplifiers in a one-on-one manner, so as to protect the inner circuit of the gain stage of the crystal oscillation circuit by means of the current-limiting ability of the current-limiting resistors. Thereby, no consideration should be given to the effect of the ESD current, and transistors having small areas may be selected for the amplifiers, so as to reduce costs.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A gain stage of crystal oscillation circuit, comprising:
   a substrate, having at least a first zone and a second zone;
   a first N doped region, disposed in the first zone;
   a plurality of first gates, disposed parallel on the first N doped region;
   a plurality of first P+ doped regions, disposed in the first N doped region;
   a plurality of second P+ doped regions, disposed in the first N doped region, wherein the first P+ doped regions serve as sources of a plurality of first transistors respectively, the first gates serve as gates of the first transistors respectively, and the second P+ doped regions serve as drains of the first transistors respectively;
   a first P doped region, disposed in the second zone, wherein the first P doped region is parallel to the first N doped region;
   a plurality of second gates, disposed parallel on the first P doped region;
   a plurality of first N+ doped regions, disposed in the first P doped region;
   a plurality of second N+ doped regions, disposed in the first P doped region, wherein the first N+ doped regions serve as sources of a plurality of second transistors respectively, the second gates serve as gates of the second transistors respectively, and the second N+ doped regions serve as drains of the second transistors respectively; and
   a plurality of metal wires, disposed parallel on the first N doped region and the first P doped region, wherein each of the metal wires is electrically coupled to the drain of at least one corresponding first transistor among the first transistors and the drain of at least one corresponding second transistor among the second transistors.

2. The gain stage of crystal oscillation circuit as claimed in claim 1, further comprising:
   a second N doped region, disposed in the first zone and parallel to the first N doped region;
   a plurality of third gates, disposed parallel on the second N doped region;
   a plurality of third P+ doped regions, disposed in the second N doped region;
   a plurality of fourth P+ doped regions, disposed in the second N doped region, wherein the third P+ doped regions serve as sources of a plurality of third transistors respectively, the third gates serve as gates of the third transistors respectively, and the fourth P+ doped regions serve as drains of the third transistors respectively;
   a second P doped region, disposed in the second zone and parallel to the first P doped region;
   a plurality of fourth gates, disposed parallel on the second P doped region;
   a plurality of third N+ doped regions, disposed in the second P doped region; and
   a plurality of fourth N+ doped regions, disposed in the second P doped region, wherein the third N+ doped regions serve as sources of a plurality of fourth transistors respectively, the fourth gates serve as gates of the fourth transistors respectively, and the fourth N+ doped regions serve as drains of the fourth transistors respectively;
   wherein the metal wires are disposed parallel on the second N doped region and the second P doped region, and each of the metal wires is electrically coupled to the drain of at least one corresponding third transistor among the third transistors and the drain of at least one corresponding fourth transistor among the fourth transistors.

3. The gain stage of crystal oscillation circuit as claimed in claim 1, wherein the sources of the first transistors are coupled to a first voltage source, and the sources of the second transistors are coupled to a second voltage source.

4. The gain stage of crystal oscillation circuit as claimed in claim 1, further comprising:
   a plurality of current-limiting resistors, disposed on the substrate, wherein first terminals of the current-limiting resistors are respectively coupled to the metal wires in a one-on-one manner, and second terminals of the current-limiting resistors are coupled together to a bonding pad.

5. The gain stage of crystal oscillation circuit as claimed in claim 4, further comprising:
   a first diode, disposed in the first zone, wherein a cathode of the first diode is coupled to a first power rail, and an anode of the first diode is coupled to the bonding pad; and
   a second diode, disposed in the second zone, wherein a cathode of the second diode is coupled to the bonding pad, and an anode of the second diode is coupled to a second power ail.

* * * * *